(12) United States Patent
Noda

(10) Patent No.: US 7,019,221 B1
(45) Date of Patent: Mar. 28, 2006

(54) PRINTED WIRING BOARD

(75) Inventor: Yuji Noda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/440,616

(22) Filed: Nov. 15, 1999

(30) Foreign Application Priority Data

Nov. 27, 1998 (JP) .......................................... 10-336769

(51) Int. Cl.
*H05K 1/03* (2006.01)

(52) U.S. Cl. ....................... 174/255; 361/792
(58) Field of Classification Search ................ 361/777, 361/779, 780, 792, 793, 794, 795; 174/255, 174/261

See application file for complete search history.

(56) References Cited

U.S. PATENT DOCUMENTS

| | | | |
|---|---|---|---|
| 5,142,239 A | 8/1992 | Brayton et al. | |
| 5,328,087 A * | 7/1994 | Nelson et al. | 228/175 |
| 5,495,395 A | 2/1996 | Yoneda et al. | |
| 5,719,749 A | 2/1998 | Stopperan | |
| 5,790,384 A * | 8/1998 | Ahmad et al. | 361/760 |
| 5,870,289 A * | 2/1999 | Tokuda et al. | 361/779 |
| 6,281,446 B1 * | 8/2001 | Sakamoto et al. | 174/255 |

FOREIGN PATENT DOCUMENTS

| | | |
|---|---|---|
| JP | 56-165389 | 12/1981 |
| JP | 3-11739 | 1/1991 |
| JP | 5-267392 | 10/1993 |
| JP | 7-30055 | 1/1995 |
| JP | 7-094901 | 4/1995 |
| JP | 8-125298 | 5/1996 |
| JP | 9-036513 | 2/1997 |
| JP | 9-298274 | 11/1997 |
| JP | 11-317582 | 11/1999 |

\* cited by examiner

*Primary Examiner*—David L. Talbott
*Assistant Examiner*—Jeremy Norris
(74) *Attorney, Agent, or Firm*—Scully, Scott, Murphy & Presser

(57) ABSTRACT

A printed wiring board including a first printed wiring board and at least one second printed wiring board composed of a different material from a material of which the first printed wiring board is composed. The second printed wiring board is fixed to at least a part of the first printed wiring board.

8 Claims, 5 Drawing Sheets

PRINTED WIRING BOARD

BACKGROUND OF THE INVENTION

1. Field of the Invention

The invention relates to a printed wiring board and an electronic part to be mounted on a printed wiring board.

2. Description of the Related Art

FIGS. 1A and 1B illustrate a conventional printed wiring board.

In a conventional method, as illustrated in FIG. 1A, there is first fabricated a module 203 comprised of a module substrate 201 and parts 202 mounted on the module substrate 201. Then, as illustrated in FIG. 1B, the module 203 as well as other parts 211 are mounted on a printed substrate 210.

This conventional method has an advantage that since the module 203 15 is fabricated separately, the module 203 can be tested one by one as to whether they properly operate. Hence, only the module having been proved to properly operate can be mounted on the printed substrate 210, which ensures that a fabrication yield of the product illustrated in FIG. 1B can be enhanced, even if the module 203 has a low fabrication yield.

However, the above-mentioned conventional method has problems as follows.

It is possible nowadays to fabricate a module with a high fabrication yield. Hence, since the parts 202 have to be mounted on the module substrate 201 at a plurality of times in accordance with the above-mentioned conventional method, there would be caused problems that fabrication efficiency is unavoidably deteriorated, and that fabrication cost of the module substrate 201 is unavoidably high. In addition, since the module substrate 201 having sufficient strength as a unit is mounted on the printed board 210, there is caused another problem that the product illustrated in FIG. 1B is unavoidably high.

Japanese Unexamined Patent Publication No. 56-165389 has suggested a hybrid integrated circuit including a first substrate and a second substrate adhered to the first substrate. The second substrate has a different material from a material of which the first substrate is composed, and a different structure from that of the first substrate. A chip-shaped part is to be mounted on the thus adhered substrates. The first substrate is formed with a recess, and the second substrate is embedded in the recess.

Japanese Unexamined Patent Publication No. 7-30055 has suggested a printed wiring board wherein a multi-chip module substrate is fixed in a pit formed at a surface of the printed wiring board.

Japanese Unexamined Patent Publication No. 3-11739 has suggested an electronic device including an electrically conductive pattern formed on a circuit board, an electrode pad formed around a semiconductor chip in a specific area, and a metal bump electrically connecting the electrically conductive pattern to the semiconductor chip. A metal layer is formed between the semiconductor chip and the circuit board in an area other than the specific area. The metal layer has almost the same thickness as that of the metal bump, and is composed of the same material as a material of which the metal bump is composed.

Japanese Unexamined Patent Publication No. 5-267392 has suggested a multi-layered wiring substrate for electrically connecting semiconductor chips to each other through solder balls. Electrodes on which the solder balls are to be mounted are arranged in point and/or line symmetry about a center of a substrate.

Japanese Unexamined Patent Publication No. 9-298274 has suggested a method of mounting a semiconductor chip, including the steps mounting a semiconductor chip on a module substrate such that the semiconductor chip makes electrical contact with the module substrate, and mounting the module substrate on a printed substrate, characterized by the steps of forming a recess at a surface of the printed substrate in alignment with the semiconductor chip mounted on the module substrate, electrically connecting the module substrate to the printed substrate, and filling a gap between the module substrate and the printed substrate with sealing resin.

SUMMARY OF THE INVENTION

In view of the above-mentioned problems, it is an object of the present invention to provide a printed wiring board capable of reducing the number of fabrication steps when a module having parts at a higher density and a module having parts at a lower density are to be mounted on a common substrate, and preventing from becoming too high, even when a lot of parts are to be stacked on a substrate.

In one aspect of the present invention, there is provided a printed wiring board comprising a first printed wiring board and at least one second printed wiring board composed of a different material from a material of which the first printed wiring board is composed, the second printed wiring board being fixed in at least a part of the first printed wiring board through an electrical conductor so that wirings of the first and second printed wiring boards are electrically connected to each other and the first and second printed wiring boards are integral with each other to thereby form a single printed wiring board.

There is further provided a printed wiring board comprising a first printed wiring board and at least one second printed wiring board composed of a different material from a material of which the first printed wiring board is composed, the first printed wiring board being formed at a surface thereof with a recess, the second printed wiring board being fixed in the recess through an electrical conductor so that wirings of the first and second printed wiring boards are electrically connected to each other and the first and second printed wiring boards are integral with each other to thereby form a single printed wiring board, the recess having a depth substantially equal to a sum of a thickness of the second printed wiring board and a thickness of the electrical conductor.

It is preferable that the recess is cubic in shape.

It is preferable that the recess is equal in size to a combination of the second printed wiring board and the electrical conductor.

The second printed wiring board may be composed of glass epoxy, polyester or ceramics.

It is preferable that the second printed wiring board is composed of a material having small high-frequency loss.

It is preferable that the second printed wiring board has a wiring pattern at a higher density than a density of a wiring pattern of the first printed wiring board.

It is preferable that the second printed wiring board is a product made through a build-up process.

It is preferable that the electrical conductor is an anisotropic electrically conductive film or an anisotropic electrically conductive paste.

It is preferable that the printed wiring board further includes a third printed wiring board being fixed in at least a part of the second printed wiring board through an electrical conductor so that wirings of the second and third printed wiring boards are electrically connected to each other and the second and third printed wiring boards are integral with each other to thereby form a single printed wiring board.

It is preferable that the printed wiring board further includes a (N+1)-th printed wiring board being fixed in at least a part of the N-th printed wiring board through an electrical conductor so that wirings of the N-th and (N+1)-th printed wiring boards are electrically connected to each other and the N-th and (N+1)-th printed wiring boards are integral with each other to thereby form a single printed wiring board, wherein N is a positive integer equal to or greater than 3.

In another aspect of the present invention, there is provided a part to be mounted on a printed wiring board, including a plurality of actual electrode terminals arranged thereon in asymmetry; and at least one dummy electrode terminal in no electrical connection with an internal wiring of the part, the dummy electrode terminal being arranged on the part such that electrode terminals including the actual electrode terminals and the dummy electrode terminal are arranged in symmetry.

It is preferable that the dummy electrode terminal is arranged on the part such that electrode terminals including the actual electrode terminals and the dummy electrode terminal are arranged in symmetry about both length-wise and width-wise directions of the part.

The advantages obtained by the aforementioned present invention will be described hereinbelow.

The present invention makes it possible to select materials of which the first and second printed wiring boards are composed and a method by which a printed wiring board is made, in accordance with a use of the printed wiring board. Hence, a printed wiring board suitable for parts to be mounted thereon would be readily fabricated.

The reason is as follows. In accordance with the present invention, parts are mounted on both the first and second printed wiring boards, after they have been adhered to each other. For instance, when a big-sized part having a greater pitch between terminals and a small-sized part having a smaller pitch between terminals are to be mounted on a common printed wiring board, the first printed wiring board is fabricated as an ordinary printed wiring board, and the second printed wiring board is fabricated by a build-up process by which a wiring could be arranged at a high density. The above-mentioned small-sized part having a smaller pitch between terminals is mounted on the second printed wiring board. Thus, parts can be mounted on a suitable printed wiring board in accordance with characteristics of the printed wiring boards.

In addition, since a build-up process which makes it possible to arrange a wiring at a high density, but is expensive is used at minimum, total fabrication cost can be reduced.

When the present invention is applied to a device such as a portable radio-signal transceiver comprised of parts relating to a radio-signal and parts relating to a control, the parts relating to a radio-signal is mounted on the second printed wiring board made by a build-up process and having a short wiring length. This arrangement makes it possible to prevent the parts from being influenced by the short wiring length, and to enhance electric characteristics of the parts as a radio-signal transceiver.

When it is necessary to enhance high frequency characteristic, the second printed wiring board is designed to have a substrate composed of a material such as Teflon having a small high frequency loss. The Teflon substrate could accomplish superior high frequency characteristic.

In addition, a dummy electrode terminal may be added to thereby make arrangement of electrode terminals symmetric in length-wise and width-wise directions of a part to be mounted on a printed wiring board, which would prevent parts from being mounted out of place and make it possible to readily and rapidly mount parts on a printed wiring board.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 1A:
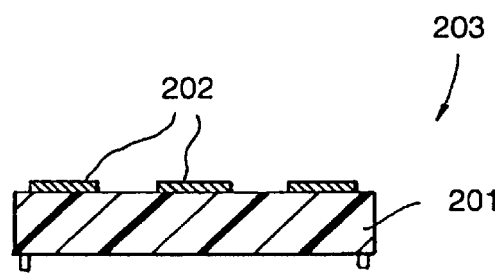
FIG. 1A is a cross-sectional view of a module.
Figure 1B:
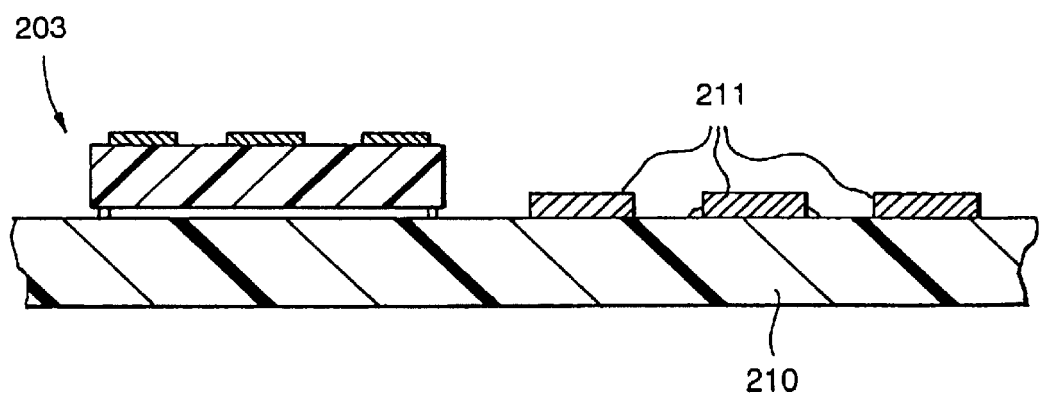
FIG. 1B is a cross-sectional view illustrating a conventional printed substrate on which a module and a part are mounted.
Figure 2A:
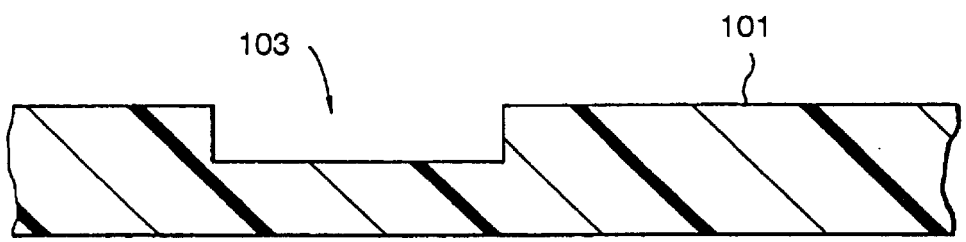
FIGS. 2A to 2C are cross-sectional views of a printed wiring board, illustrating respective steps of a method of fabricating a printed wiring board in accordance with the first embodiment of the present invention.
Figure 2B:
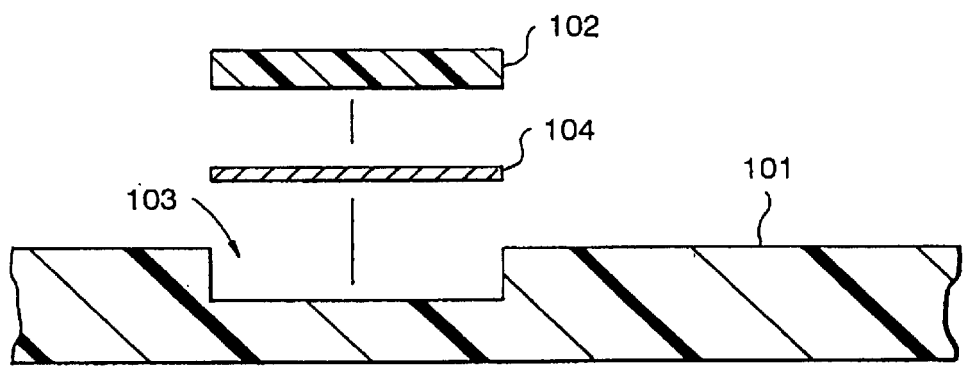
Figure 2C:
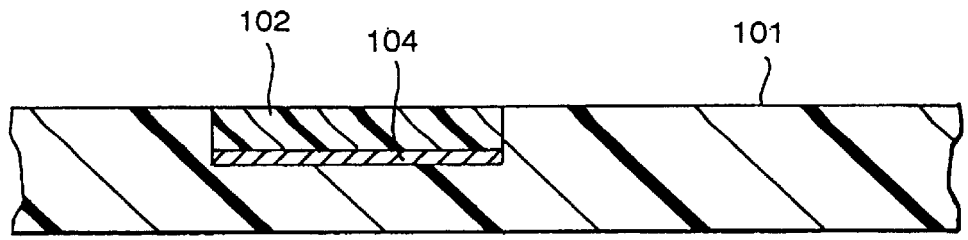
Figure 3:
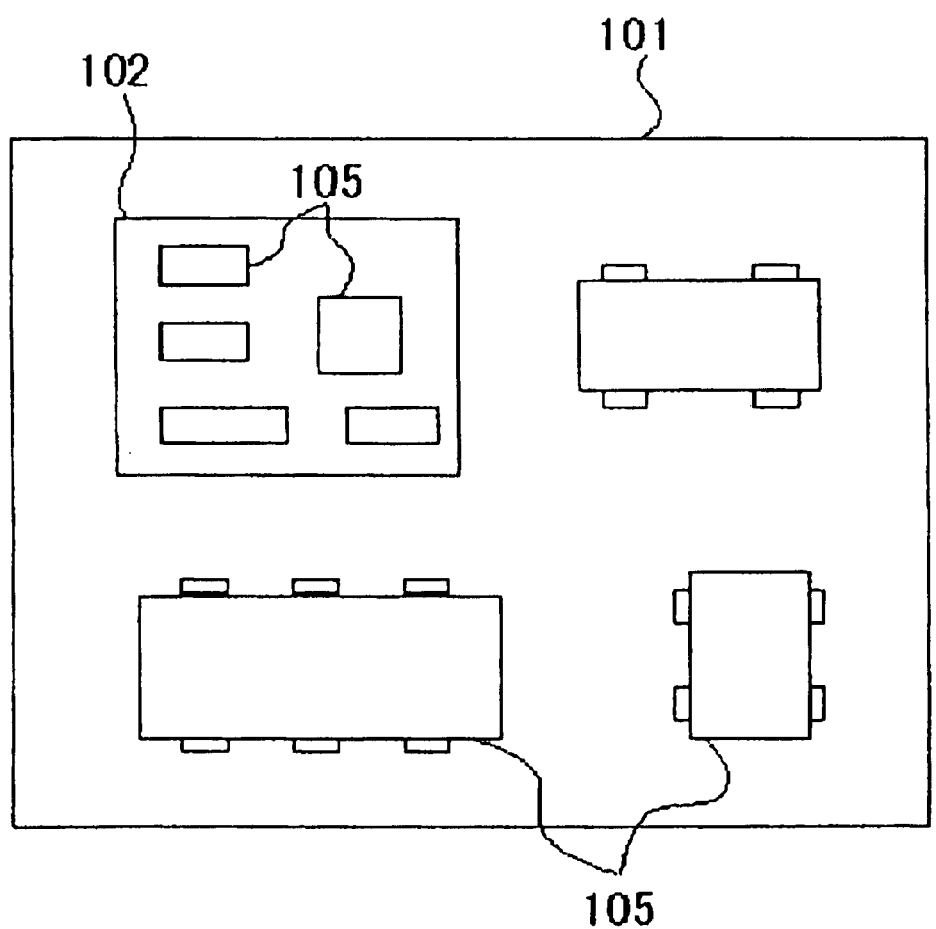
FIG. 3 is a top plan view of the printed wiring board in accordance with the first embodiment, on which parts are mounted.

FIGS. 2A to 2C illustrate respective steps of a method of fabricating a printed wiring board in accordance with the first embodiment, and FIG. 3 illustrates the printed wiring board on which parts are mounted.

Hereinbelow is explained a method of fabricating a printed wiring board in accordance with the first embodiment, with reference to FIGS. 2A to 2C.

First, as illustrated in FIG. 2A, a first printed wiring board 101 is formed at a surface with a recess 103 into which a second printed wiring board 102 is to be buried as mentioned later. In the first embodiment, the recess 103 is formed cubic.

Then, as illustrated in FIG. 2B, an anisotropic electrically conductive film 104 is formed at a bottom of the recess 103 for electrical connection and mechanical connection between the first and second printed wiring boards 101 and 102.

Then, as illustrated in FIGS. 2B and 2C, the second printed wiring board 102 is buried into the recess 103 on the anisotropic electrically conductive film 104.

The anisotropic electrically conductive film 104 is kept at about 130 to 210 degrees centigrade and at 30 to 50 kg/cm$^2$ for about 5 to 30 seconds, for instance, to thereby ensure vertical electrical connection between electrodes of the first and second printed wiring boards 101 and 102, and mechanical connection between the first and second printed wiring boards 101 and 102.

After making the first and second printed wiring boards 101 and 102 integral with each other in such a manner as mentioned above, parts 105 are mounted on the first and/or second printed wiring boards 101 and 102, as illustrated in FIG. 3.

Thus, the step of mounting the parts 105 is completed.

Though the anisotropic electrically conductive film 104 is used for electrically and mechanically connecting the first and second printed wiring boards 101 and 102 therethrough in the embodiment, there may be used an anisotropic electrically conductive paste in place of the anisotropic electrically conductive film 104.

The cubic recess 103 is designed to have a depth approximately equal to a sum of a thickness of the second printed wiring board 102 and a thickness of the anisotropic electrically conductive film 104. By designing the recess 103 to have such a depth, the first and second printed wiring boards 101 and 102 would have planarized surfaces, that is, surfaces having the same height, as illustrated in FIG. 2C. Thus, it is possible to eliminate a step between the first and second printed wiring boards 101 and 102, which would ease subsequent steps of mounting parts on the first and second printed wiring boards 101 and 102.

The above-mentioned embodiment makes it possible to select materials of which the first and second printed wiring boards 101 and 102 are composed and a method by which the first and second printed wiring boards 101 and 102 are made, in accordance with how the first and second printed wiring boards 101 and 102 are used. For instance, the first printed wiring board 101 may be made through an ordinary process for making a printed wiring board, and big-sized parts are mounted on the first printed wiring board 101 in order to reduce fabrication costs thereof, whereas the second printed wiring board 102 may be made by a build-up process to thereby mount parts having a quite small pitch thereon at a high density.

The second printed wiring board 102 may be comprised of a ceramic substrate or a Teflon substrate in accordance with how the second printed wiring board 102 is used.

The above-mentioned embodiment makes it possible to mount parts at a time, even though two different printed wiring boards are used.

Though the printed wiring board in accordance with the embodiment is designed to include one second printed wiring board 102, the printed wiring board in accordance with the embodiment may be designed to include two or more second printed wiring boards 102.

In addition, a third printed wiring board may be incorporated into the second printed wiring board 102.

Materials of which the first and second printed wiring boards 101 and 102 are composed and a method by which the first and second printed wiring boards 101 and 102 are fabricated may be optimized in dependence on parts to be mounted thereon, which would enhance the advantages obtained by the embodiment.

[Second Embodiment]

Figure 4A:
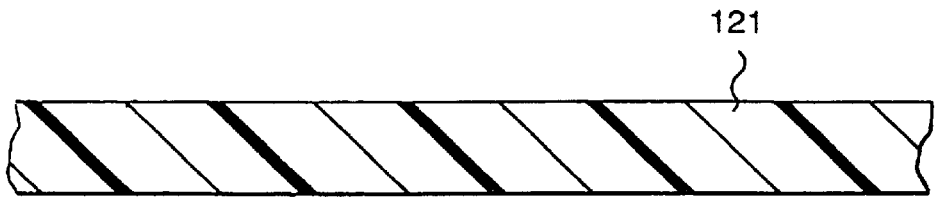
FIGS. 4A to 4C are cross-sectional views of a printed wiring board, illustrating respective steps of a method of fabricating a printed wiring board in accordance with the second embodiment of the present invention.
Figure 4B:
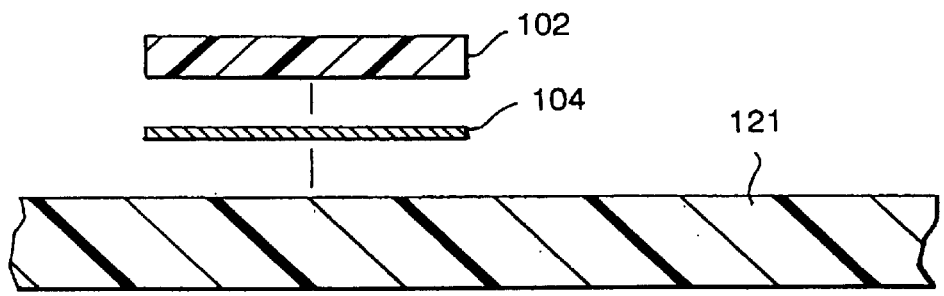
Figure 4C:
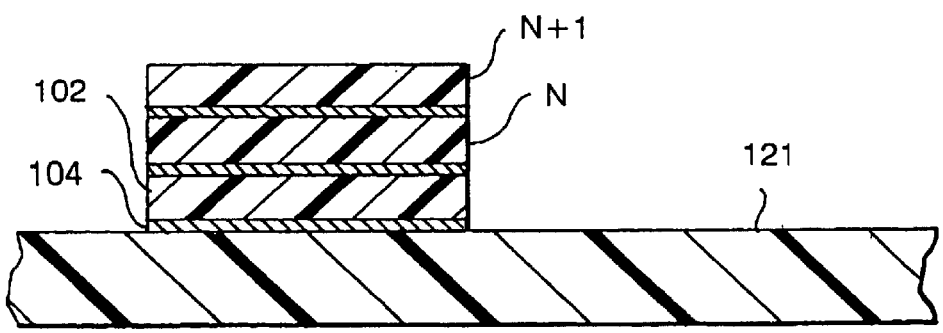

A printed wiring board in accordance with the second embodiment is explained hereinbelow with reference to FIGS. 4A to 4C. FIGS. 4A to 4C are cross-sectional views illustrating respective steps of a method of fabricating a printed wiring board in accordance with the second embodiment.

In the above-mentioned first embodiment, the first printed wiring board 101 is formed with the recess 103. In contrast, in accordance with the second embodiment, the second printed wiring board 102 is mounted directly on a first printed wiring board 121 with the anisotropic electrically conductive film 104 being sandwiched therebetween, without forming the first printed wiring board 121 with a recess such as the recess 103.

Hereinbelow is explained a method of fabricating a printed wiring board in accordance with the second embodiment, with reference to FIGS. 4A to 4C.

First, as illustrated in FIG. 4A, there is prepared a first printed wiring board 121 which is not formed with a recess.

Then, as illustrated in FIG. 4B, an anisotropic electrically conductive film 104 is formed directly on the first printed wiring board 121.

Then, the second printed wiring board 102 is mounted on the anisotropic electrically conductive film 104.

The anisotropic electrically conductive film 104 is kept at about 130 to 210 degrees centigrade and at 30 to 50 kg/cm$^2$ for about 5 to 30 seconds, for instance, to thereby ensure vertical electrical connection between electrodes of the first and second printed wiring boards 101 and 102, and mechanical connection between the first and second printed wiring boards 101 and 102.

After making the first and second printed wiring boards 101 and 102 integral with each other in such a manner as mentioned above, parts 105 are mounted on the first and/or second printed wiring boards 101 and 102, as illustrated in FIG. 3.

Thus, the step of mounting the parts 105 is completed.

As mentioned earlier, it is preferable for a printed wiring board to have no steps at a surface thereof. However, if the first printed wiring board 101 had a thickness equal to or smaller than 0.5 mm, it would be quite difficult or almost impossible to form the first printed wiring board 101 with the recess 103 into which the second printed wiring board 102 is to be buried, in such a manner as having been mentioned in the first embodiment.

Hence, in the case that the first printed wiring board 101 had a thickness equal to or smaller than 0.5 mm, it would be effective to mount the second printed wiring board 102 directly on the first printed wiring board 101 without forming the first printed wiring board 101 with the recess 103, and to electrically and mechanically connect the first and second printed wiring boards 101 and 102 through the anisotropic electrically conductive film 104, as illustrated in FIGS. 4A to 4C.

In comparison with the above-mentioned first embodiment, the second embodiment has an advantage of reduction in fabrication cost because of formation of no recess. However, since the second printed wiring board 102 projects upwardly above the first printed wiring board 121, some subsequent steps may not be able to be carried out. In particular, a step of printing creamy solder cannot be carried out because of the projection. In order to enable to carry out the step of printing creamy solder, it is necessary to use a solder mask having a projection in alignment with the projection comprised of the second printed wiring board 102.

[Third Embodiment]

Figure 5A:
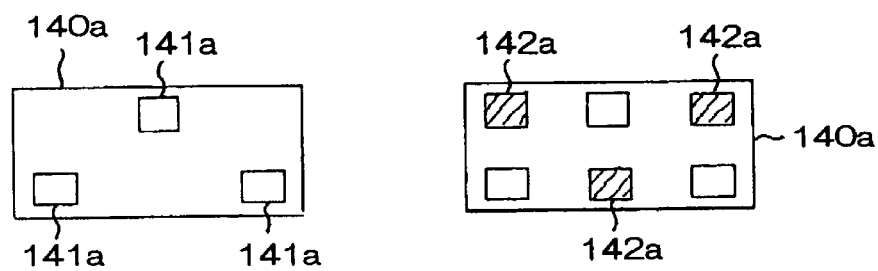
FIGS. 5A to 5C are top plan views of electrodes of parts to be mounted on a printed wiring board in accordance with the third embodiment.
Figure 5B:
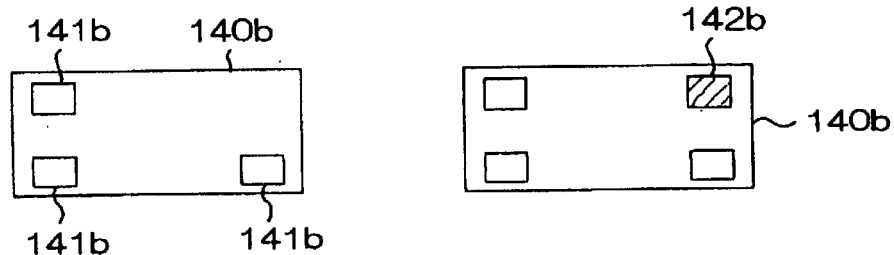
Figure 5C:
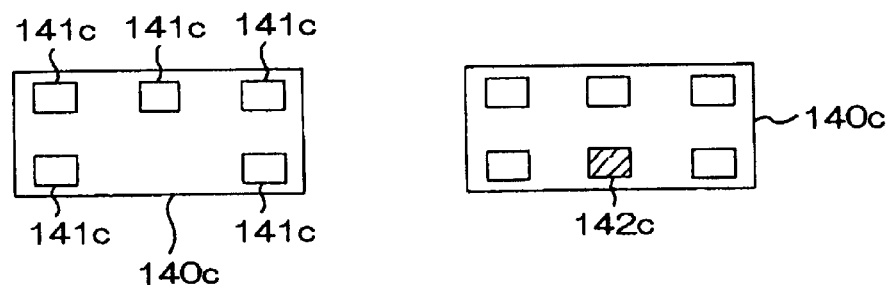

An arrangement of electrodes of a part to be mounted on a printed wiring board in accordance with the third embodiment is explained hereinbelow with reference to FIGS. 5A to 5C. FIGS. 5A to 5C are plan views of an arrangement of electrodes of a part to be mounted on a printed wiring board.

FIG. 5A illustrates a part 140$a$ in accordance with a first example. The part 140$a$ illustrated at the left in FIG. 5A is designed to include three electrode terminals 141 located in a triangle. As illustrated at the right in FIG. 5A, dummy electrode terminals 142$a$ are located in a reverse-triangle, that is, dummy electrode terminals 142$a$ are arranged in such a fashion that the electrode terminals 141$a$ and the dummy electrode terminals 142$a$ are symmetrically located about a horizontal line passing through a center of the part 140$a$.

FIG. 5B illustrates a part 140b in accordance with a second example. The part 140b illustrated at the left in FIG. 5B is designed to include three electrode terminals 141b located at three corners out of four corners. As illustrated at the right in FIG. 5B, a dummy electrode terminal 142b is located at the remaining corner of the part 140b. As a result, the electrode terminals 141b and the dummy electrode terminal 142b are symmetrically located about both vertical and horizontal lines passing through a center of the part 140b.

FIG. 5C illustrates a part 140c in accordance with a third example. The part 140c illustrated at the left in FIG. 5C is designed to include five electrode terminals 141c located at four corners of the part 140c and at a center of a long side of the part 140c. As illustrated at the right in FIG. 5C, a dummy electrode terminal 142c is located at a center of the other long side of the part 140c. As a result, the electrode terminals 141c and the dummy electrode terminal 142c are symmetrically located about both vertical and horizontal lines passing through a center of the part 140c.

As illustrated in FIGS. 5A to 5C, addition of the dummy electrode terminal(s) 142a, 142b and 142c to the electrode terminals 141a, 141b and 141c results in line symmetry in arrangement of electrode terminals with respect to an X-axis direction, namely, a length-wise direction, and a Y-axis direction, namely, a width-wise direction.

For instance, a transistor is generally designed to have three input/output terminals, generally, a collector, a base and an emitter. When a part having electrode terminals arranged in such a manner as illustrated at the left in FIGS. 5A to 5C is to be mounted on a printed wiring board, the electrode terminals are not always properly soldered in self-aligning fashion, resulting in that the electrode terminals are mounted at a location horizontally deviated from an intended location, or mounted at an angle from an intended location.

Such deviation is likely to occur in a smaller and lighter part. However, as illustrated at the right in FIGS. 5A to 5C, it is possible to prevent such a problem that the part 140a, 140b or 140c is not properly positioned, by adding the dummy electrode terminal(s) 142a, 142b and 142c to thereby make a line-symmetric arrangement of electrode terminals with respect to X- and Y-axes directions.

It is not necessary for the dummy electrode terminal 142a, 142b and 142c to be electrically connected to internal functional devices incorporated in the part 140a, 140b or 140c. What is required to the dummy electrode terminals 142a, 142b and 142c is to have an electrode terminal structure which can be soldered to a printed wiring board.

In addition, by mounting the part 140a, 140b or 140c as illustrated in FIGS. 5A to 5C on the printed wiring boards in accordance with the above-mentioned first and second embodiments, it would be possible to mount parts on a printed wring board with higher accuracy and in a shorter period of time.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-336769 filed on Nov. 27, 1998 including specification, claims, drawings and summary is incorporated herein by reference in its entirety.

What is claimed is:

1. A printed wiring board comprising a first printed wiring board and at least one second printed wiring board composed of a different material from a material of which said first printed wiring board is composed;

said second printed wiring board being fixed in at least a part of said first printed wiring board through an electrical conductor so that wirings of said first and second printed wiring boards are electrically connected to each other and said first and second printed wiring boards are integral with each other to thereby form a single printed wiring board;

the printed wiring board further comprising a third printed wiring board being fixed in at least a part of said second printed wiring board through an electrical conductor so that wirings of said second and third printed wiring boards are electrically connected to each other and said second and third printed wiring boards are integral with each other to thereby form a single printed wiring board.

2. The printed wiring board as set forth in claim 1, wherein said second printed wiring board is composed of one of glass epoxy, polyester, and ceramics.

3. The printed wiring board as set forth in claim 1, wherein said second printed wiring board is composed of a material having small high-frequency loss.

4. The printed wiring board as set forth in claim 1, wherein said second printed wiring board has a wiring pattern at a higher density than a density of a wiring pattern of said first printed wiring board.

5. The printed wiring board as set forth in claim 1, wherein said second printed wiring board is a product made through a build-up process.

6. The printed wiring board as set forth in claim 1, wherein said electrical conductor is an anisotropic electrically conductive film.

7. The printed wiring board as set for in claim 1, wherein said electrical conductor is an anisotropic electrically conductive plate.

8. The printed wiring board as set forth in claim 1, further comprising a (N+1)-th printed wiring board being fixed in at least a part of said N-th printed wiring board through an electrical conductor so that wirings of said N-th and (N+1)-th printed wiring boards are electrically connected to each other and said N-th and (N+1)-th printed wiring boards are integral with each other to thereby form a single printed wiring board, wherein N is a positive integer equal to or greater than 3.

* * * * *